(12) United States Patent
Van Dam

(10) Patent No.: US 7,148,954 B2
(45) Date of Patent: Dec. 12, 2006

(54) LITHOGRAPHIC APPARATUS AND METHOD FOR ITS USE

(75) Inventor: Marinus Johannes Maria Van Dam, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/086,662

(22) Filed: Mar. 23, 2005

(65) Prior Publication Data

US 2006/0215141 A1 Sep. 28, 2006

(51) Int. Cl.
G03B 27/42 (2006.01)
G03B 27/54 (2006.01)
G03B 27/32 (2006.01)
G06F 19/00 (2006.01)

(52) U.S. Cl. .......................... 355/53; 355/67; 355/77; 700/121

(58) Field of Classification Search .............. 355/53, 355/67, 77; 700/121; 716/19, 21
See application file for complete search history.

(56) References Cited

U.S. PATENT DOCUMENTS

| | | | |
|---|---|---|---|
| 6,263,255 B1 * | 7/2001 | Tan et al. | 700/121 |
| 2003/0013213 A1 * | 1/2003 | Takano | 438/14 |
| 2004/0088071 A1 * | 5/2004 | Kouno et al. | 700/121 |
| 2005/0206850 A1 * | 9/2005 | Shimizu et al. | 353/55 |

* cited by examiner

*Primary Examiner*—Alan Mathews
(74) *Attorney, Agent, or Firm*—Pillsbury Winthrop Shaw Pittman LLP

(57) ABSTRACT

An apparatus and method for imaging a pattern onto a substrate is described. A recipe for producing an image includes optional tool-type information. Where tool-type information indicates that the recipe pertains to a different tool type, the apparatus makes adjustments to its imaging settings in order to emulate performance of the different tool type.

21 Claims, 1 Drawing Sheet

LITHOGRAPHIC APPARATUS AND METHOD FOR ITS USE

BACKGROUND OF THE INVENTION

1. Field of the Invention

The present invention relates to a lithographic apparatus and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Optical proximity effects are a characteristic of optical projection exposure tools. More specifically, proximity effects occur when very closely spaced circuit patterns are transferred to a resist layer on a wafer. The light waves of the closely spaced circuit features interact, thereby distorting the final transferred pattern features. In other words, diffraction causes adjacent features to interact with each other in such a way as to produce pattern dependent variations. The magnitude of the OPE on a given feature depends on the feature's placement on the mask with respect to other features.

One of the primary problems caused by such proximity effects is an undesirable variation in feature critical dimensions (CDs). For any leading-edge semiconductor process, achieving tight control over the CDs of the features (i.e., circuit elements and interconnects) is a primary manufacturing goal, since it has a direct impact on wafer sort yield and speed-binning of the final product.

One technique for reducing CD variation involves adjusting the illumination characteristics of the exposure tool. More specifically, by carefully selecting the ratio of the numerical aperture of the illumination condenser ("NAc") to the numerical aperture of the imaging objective lens ("NAo") (this ratio has been referred to as the partial coherence ratio–$\sigma$), the degree of OPE can be manipulated to some extent.

In addition to using relatively incoherent illumination, such as described above, OPE can also be compensated for by "pre-correcting" the mask features. This family of techniques is generally known as optical proximity correction (OPC) techniques. In OPC techniques, additional, generally sub-resolution, assist features are included in the pattern. While the assist features themselves are not imaged, they produce changes in the diffraction pattern, resulting in changes to the imaged features.

For example, scattering bars (also known as intensity leveling bars or assist bars) are correction features (typically non-resolvable by the exposure tool) that are placed next to isolated feature edges on a mask in order to adjust the edge intensity gradients of the isolated edges. In theory, the adjusted edge intensity gradients of the isolated edges match the edge intensity gradients of the dense feature edges, thereby causing the SB-assisted isolated features to have nearly the same width as densely nested features.

SUMMARY OF THE INVENTION

When newer, higher-resolution machines are used in combination with older, lower-resolution machines, there can be a significant mismatch between proximity effects. That is, for a given pattern, the high-resolution machine will show different proximity effects than does the lower-resolution machine. There are several metrics available to determine or describe the proximity difference between machines. One example is known as iso-dense bias, but in general a customer will use his own metric to determine these differences. These metrics are generally based on the requirements of the exposed layer.

The inventor has determined that it is desirable to allow for this mismatch by both accounting for its existence and by modifying a machine control system to provide for corrections or other process control.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm).

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens"

herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiply stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
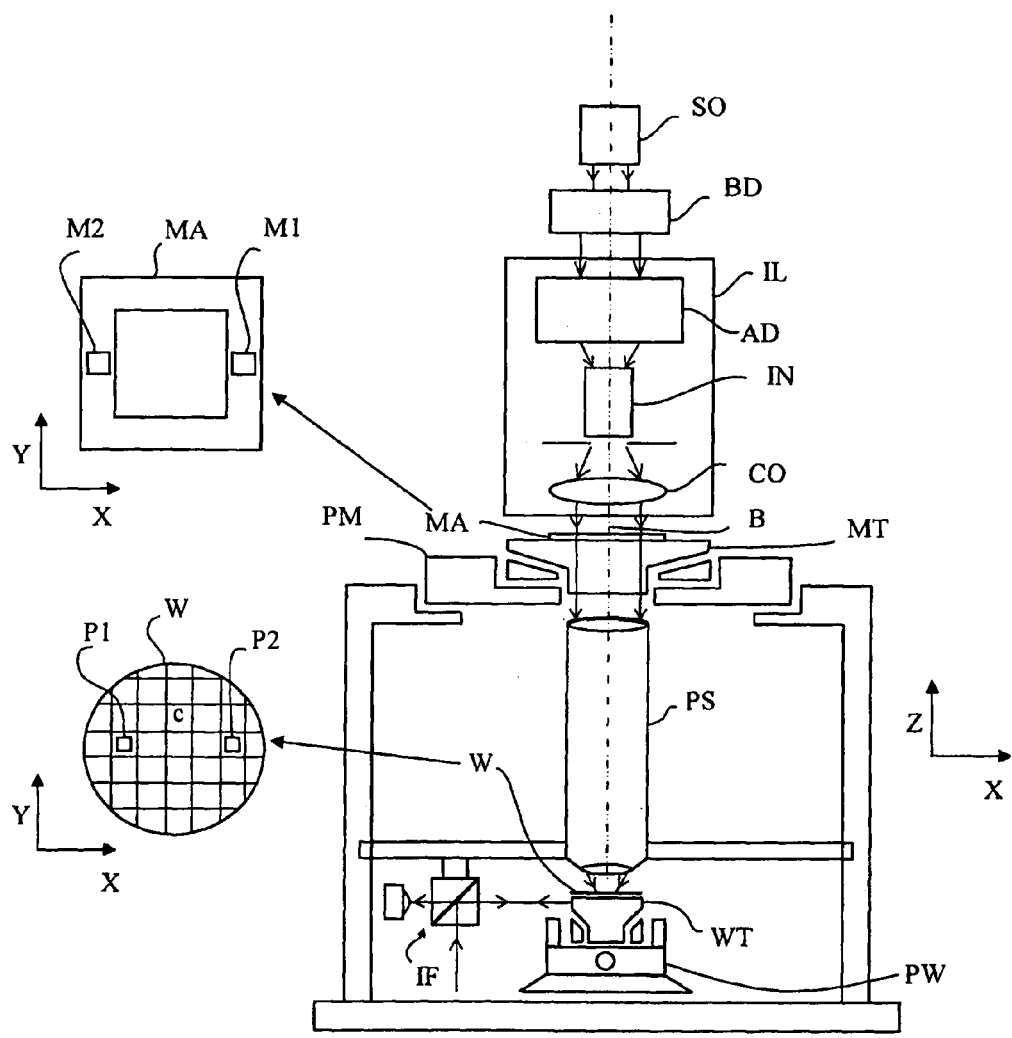
FIG. 1 depicts a lithographic apparatus which may be used to carry out the invention.

FIG. 1 schematically depicts a lithographic apparatus according to one embodiment of the invention. The apparatus includes an illumination system (illuminator) IL configured to condition a radiation beam B (e.g., UV radiation or DUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As herein depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

As described above, there are a number of controllable variables in lithographic imaging. Illumination modes, exposure time and dosage may all be adjusted in order to maximize system performance. Thus, for any given imaging task, a particular recipe, or set of data indicating the particular settings of the machine for performing that task, are determined and used. In an example of an embodiment of the present invention, a tool type parameter is one of the parameters that is available to be configured as a part of a recipe.

In a given fabrication facility, a number of different lithography tool types may be present. In many cases, newer generation tools are used in combination with older generation tools in order to complete a given manufacturing task. Normally, the newer generation tools are used to image so-called critical layers, that is those layers that have the highest requirements for resolution, overlay and CD performance. However, in the case that a given manufacturing process does not require the improved performance available from the newer generation tools, those tools may be employed to produce lower resolution layers along with the older generation tools.

As noted above, a recipe developed for an older generation tool may not work properly on a newer generation tool due to, for example, iso-dense bias mismatch. In that case, when such a recipe is provided to the newer generation tool, it should include the tool type parameter, allowing the newer generation tool to determine that the recipe corresponds to the older generation tool.

By way of example, if a facility contains some Model A lithography tools and some newer Model B tools, then when a recipe developed for the Model A tools is input into the Model B tools, the Model B tool will check for the presence or absence of a tool type parameter in the input data. Upon reading the tool type parameter and determining that the recipe is intended for a Model A tool, the Model B tool's controller will adjust imaging parameters in order to match better the performance of the Model A tool.

In particular, the Model B tool's controller can control, for example, illumination settings, projection lens settings, and/or other settings of the apparatus in order to alter the contrast so as to adapt the imaging performance to emulate more closely the performance of the Model A. For example, contrast can be controlled, thereby matching the performance of the Model A tool. In order to change contrast, several system-parameters can be used. By way of non-limiting example, changing the illumination settings (sigma inner, outer, degree of polarization), projection lens settings (NA, aberration performance) or laser settings (bandwidth, nominal wavelength), could all be used to alter system contrast. Likewise, altering an average position of the wafer stage relative to the focal plane by, for example, tilting the wafer stage during scanning, or mechanically vibrating the wafer stage in the Z direction could be used.

Alternately, the Model B can, upon reading that the recipe is intended for use on a Model A, so indicate to an operator or to a computer controller. An operator could then, for example, provide a different recipe, move the wafer batch to an appropriate machine, or determine that the operation should go ahead despite the warning. Other possible solutions should be apparent to the skilled artisan.

In the opposite situation, where a Model A tool reads a recipe with a tool type indicator that indicates that the recipe is designed for use on a Model B tool, it will, in general, be impossible for the Model A parameters to be adjusted to provide performance that is equal to that of the Model B tool. In this case also, a warning or other indicator can be activated. Thus, when a critical step that requires the use of the best-available tool is attempted on a less advanced model, an operator can be warned, the processing can be stopped, and the batch can be moved to an appropriate tool.

In the situation that the controller checks for a tool type parameter and determines that one is not present, the recipe can be followed without making any adjustments. Alternately, a warning can be activated, allowing intervention by an operator to ensure that the proper tool is being used for the process.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5–20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   a control system, configured to allow the setting of a plurality of machine parameters for an imaging process, checking the plurality of machine parameters to determine the presence or absence of a tool type parameter, and if a tool type parameter is present, controlling the lithographic apparatus to change a contrast of the lithographic apparatus, in accordance with a tool type indicated by the tool type parameter.

2. Apparatus as in claim 1, wherein the control system is configured to alter an angular intensity distribution of the radiation beam to change the contrast.

3. Apparatus as in claim 2, wherein the control system is configured to alter an inner and/or outer radial extent of the angular intensity distribution.

4. Apparatus as in claim 2, wherein the control system is configured to control illumination system to alter the angular intensity distribution of the radiation beam.

5. Apparatus as in claim 1, wherein the control system is configured to control a wavelength spectrum of the radiation beam to change the contrast.

6. Apparatus as in claim 1, wherein the control system is configured to control a position of the substrate table to change the contrast.

7. Apparatus as in claim 6, wherein the control system is configured to control the position of the substrate table by imparting a tilt to the substrate table during a scanning operation.

8. A device manufacturing method using a lithographic apparatus comprising:
   setting a plurality of machine parameters for an imaging process;

checking the plurality of machine parameters to determine the presence or absence of a tool type parameter;

if a tool type parameter is present, adapting a contrast setting in accordance with a tool type indicated by the tool type parameter;

projecting a patterned beam of radiation onto a layer of radiation sensitive material on a substrate using the machine parameters.

9. A method as in claim 8, wherein the adapting comprises altering an angular intensity distribution of the radiation beam to change the contrast.

10. A method as in claim 9, wherein the altering comprises altering an inner and/or outer radial extent of the angular intensity distribution.

11. A method as in claim 9, wherein the altering comprises altering the angular intensity distribution of the radiation beam using an illumination system of the lithographic apparatus.

12. A method as in claim 8, wherein the adapting comprises controlling a wavelength spectrum of the radiation beam to change the contrast.

13. A method as in claim 8, wherein the adapting comprises controlling a position of a substrate table of the lithographic apparatus to change the contrast.

14. A method as in claim 13, wherein the controlling comprises imparting a tilt to the substrate table during a scanning operation.

15. A machine readable medium having machine executable instructions for performing a device manufacturing method using a lithographic apparatus comprising:

setting a plurality of machine parameters for an imaging process;

checking the plurality of machine parameters to determine the presence or absence of a tool type parameter;

if a tool type parameter is present, adapting a contrast setting in accordance with a tool type indicated by the tool type parameter;

projecting a patterned beam of radiation onto a layer of radiation sensitive material on a substrate using the machine parameters.

16. A machine readable medium as in claim 15, wherein the adapting comprises altering an angular intensity distribution of the radiation beam to change the contrast.

17. A machine readable medium as in claim 16, wherein the altering comprises altering an inner and/or outer radical extent of the angular intensity distribution.

18. A machine readable medium as in claim 16, wherein the altering comprises altering the angular intensity distribution of the radiation beam using an illumination system of the lithographic apparatus.

19. A machine readable medium as in claim 15, wherein the adapting comprises controlling a wavelength spectrum of the radiation beam to change the contrast.

20. A machine readable medium as in claim 15, wherein the adapting comprises controlling a position of a substrate table of the lithographic apparatus to change the contrast.

21. A machine readable medium as in claim 20, wherein the controlling comprises imparting a tilt to the substrate table during a scanning operation.

* * * * *